United States Patent [19]

Linger

[11] Patent Number: 4,672,676
[45] Date of Patent: Jun. 9, 1987

[54] MEHTOD AND APPARATUS FOR AUTOMATICALLY ALIGNING AN OBJECT WITH RESPECT TO A REFERENCE PATTERN

[75] Inventor: Claude J. Linger, Paris 20eme, France

[73] Assignee: Intenational Business Machines Corp., Armonk, N.Y.

[21] Appl. No.: 684,632

[22] Filed: Dec. 20, 1984

[30] Foreign Application Priority Data

Dec. 28, 1983 [EP] European Pat. Off. ............ 83430042

[51] Int. Cl.$^4$ .............................................. G06K 9/00
[52] U.S. Cl. ......................................... 382/8; 382/45; 358/101; 356/401
[58] Field of Search ................ 356/401, 398, 399, 400; 250/492.2, 561; 382/8, 44, 45, 46; 358/101

[56] References Cited

U.S. PATENT DOCUMENTS

| | | | |
|---|---|---|---|
| 4,052,603 | 10/1977 | Karlson | 250/566 |
| 4,259,019 | 3/1981 | Johannsmeier et al. | 356/400 |
| 4,319,272 | 3/1982 | Henry | 358/107 |
| 4,364,086 | 12/1982 | Guth | 358/101 |
| 4,365,163 | 12/1982 | Davis et al. | 250/491.1 |
| 4,477,926 | 10/1984 | Linger et al. | 382/8 |
| 4,481,664 | 11/1984 | Linger et al. | 382/8 |

Primary Examiner—Leo H. Boudreau
Assistant Examiner—Jose L. Couso
Attorney, Agent, or Firm—John D. Crane; Robert E. Sandt

[57] ABSTRACT

A method and apparatus for aligning a ceramic substrate provided with two small alignment crosses formed at the same time as the metallic pattern and located on both sides of a symmetry axis, said substrate being disposed on an alignment platen. The method includes the steps of generating in two insepection windows, comprised each of a matrix of photodiodes divided into quadrants i (i=1, 2, 3, 4), a reference image of the same dimensions as the image of each cross, and determining, for each quadrant and for each cross, "exposed" areas ($S_i^+$, $S_i^{+\prime}$) corresponding to those portions of the image of the cross which extend beyond the outline of the reference image, and "masked" areas ($S_i^-$, $S_i^{-\prime}$) corresponding to those portions of the reference image which extend beyond the outline of the image of the cross. The values of said areas are used to compute the corrections ($\Delta x$, $\Delta y$; $\Delta x'$, $\Delta y'$) required to cause the center of a cross to coincide with its ideal position in the center of the corresponding inspection window. The final corrections ($\Delta X, \Delta Y, \Delta \theta$) required to adjust the alignment platen are defined as:

$$\Delta X = \frac{\Delta x + \Delta x'}{2} \quad \Delta Y = \frac{\Delta y + \Delta y'}{2} \quad \Delta \theta = \frac{\Delta y - \Delta y'}{2d}$$

(where is the distance between the two crosses and also between the centers of the inspection windows). The advantage of this method is that it deals with areas and therefore minimizes the adverse effects of the irregularities of the crosses that are inherent in the metallization process.

14 Claims, 13 Drawing Figures

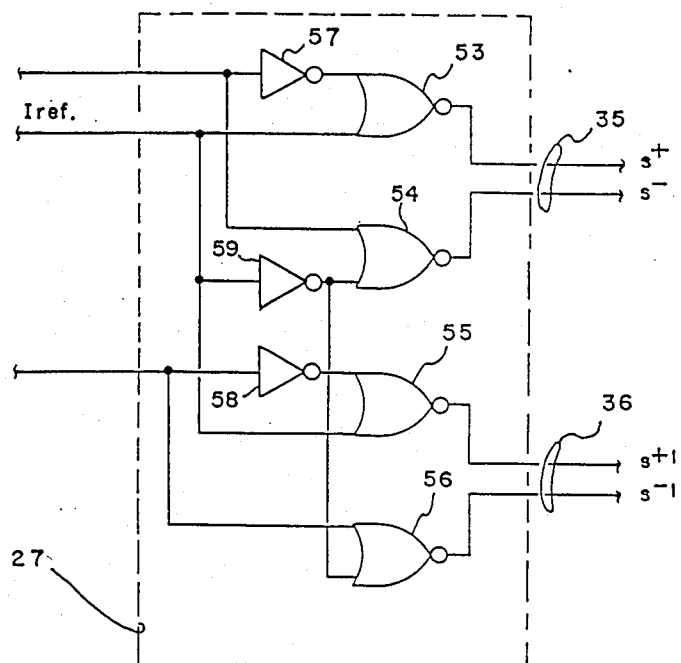
FIG.11
FIG.12
$I_{mir}$
$I_{ref.}$
$s^+$
$s_1^+(00)$

METHOD AND APPARATUS FOR AUTOMATICALLY ALIGNING AN OBJECT WITH RESPECT TO A REFERENCE PATTERN

TECHNICAL FIELD

This invention relates to techniques for automatically matching objects and, more particularly, to a method and apparatus for automatically aligning an object with respect to a reference pattern.

Various techniques are used in the industry for inspecting mass-produced objects such as integrated circuits to eliminate possible defects and lower manufacturing costs.

For example, in the manufacture of electronic modules comprised of a ceramic substrate and an overlying metallization pattern providing electrical interconnections between a silicon chip and connection pins, an inspection is necessary in order to detect short circuits, open circuits and other abnormal conditions.

Formerly, the inspection of metal patterns, which necessitated the prior alignment of the substrates, required the use of a microscope. This method was unreliable, because of the possibility of human errors, and too costly to allow more than a limited number of samples, representing a relatively small percentage of the total production, to be inspected. Thus, by no means all faulty modules could be detected.

Automatic inspection techniques were subsequently developed, as described, for example, in European patent application EP Nos. 80430033.3 and 80430030.9 filed by the present applicant Dec. 18, 1980. However, in the particular case of ceramic substrates, the efficient use of these techniques requires that an automatic alignment station be employed.

Such stations have been proposed in the prior art and usually comprise sophisticated electro-optical devices such as the focusing and collimating systems described, in particular, in U.S. Pat. Nos. 4,052,603 and 4,365,163, for comparing one or more alignment marks provided on each substrate with one or more reference marks. However, the presence of these devices increases the complexity of the station, which is not desirable. Also, the alignment marks usually are formed at the same time as the metallization pattern and may themselves have defects which could affect the accuracy of the alignment.

The present invention overcomes these difficulties by means of a novel method and apparatus for automatically aligning an object provided with a couple of alignment marks having a given surface area, with respect to a reference mark. To this end, the area of the enlarged image of each alignment mark is compared with that of an electronic (virtual) image used as a reference mark that is generated in the center of an inspection window. The axis of reference is the line segment of length d between the centers of the two inspection windows. The center of reference is the midpoint of the line segment between the two centers. The advantage of this technique is that it eliminates the need to use the complex and costly optical devices normally required for comparing optical images, and renders physical reference marks unnecessary. Also, the invention reduces to a considerable extent the adverse effects of the physical irregularities that inevitably occur during the process of forming alignment marks.

Briefly, the invention relates to a method of automatically aligning an object provided with two alignment marks having predetermined areas and located a given distance d from each other, with respect to reference means comprised of two inspection windows whose centers are separated by said distance d, the line segment between said centers defining an axis of reference whose midpoint defines in turn a center of reference. The method comprises the steps of:

placing the object on an alignment platen;

using known techniques to achieve a coarse prealignment of said object to cause the image ($I_{MIR}, I'_{MIR}$) of each alignment mark to be entirely contained within a corresponding inspection window divided into quadrants;

generating in the center of each inspection window a reference mark's virtual image ($I_{REF}$) having the same dimensions as the alignment mark's image ($I_{MIR}, I'_{MIR}$) and superimposed on the latter image;

determining, for each mark and for each quadrant i (with i=1, 2, 3, 4), the areas of those portions of the alignment mark's image ($I_{MIR}, I'_{MIR}$) which extend beyond the outline of the reference mark's image ($I_{REF}$), that is, which are not masked by $I_{REF}$, and the areas of those portions of said reference mark's image ($I_{REF}$) which extend beyond the outline of the alignment mark's image ($I_{MIR}, I'_{MIR}$), that is, which are masked by the latter image, said areas being respectively termed "exposed" ($S_i^+, S_i^{+\prime}$) and "masked" ($S_i^-, S_i^{-\prime}$); and, using computation means to determine from the values of said areas the translational error corrections ($\Delta X, \Delta Y$) and the rotational error corrections ($\Delta \theta$) required to adjust the position of said platen to cause the object thereon to be correctly aligned.

The invention further relates to apparatus for implementing said method. The apparatus includes the following:

support means the translation and rotation of which can be controlled, for supporting said object provided with two alignment marks each of which has a given area;

inspection means comprising two inspection windows divided into quadrants and disposed so that the images ($I_{MIR}, I'_{MIR}$) of said alignment marks are fully contained therein, and scanning means generating a binary signal $I_{mir}, I'_{mir}$ whenever all successive lines that comprise an image within one of said windows have been scanned;

means for generating a binary signal ($I_{ref}$) corresponding to a reference mark's virtual image ($I_{REF}$) having the same dimensions as the corresponding alignment mark's image ($I_{MIR}, I'_{MIR}$), with the center of said image $I_{REF}$ coinciding with that of said inspection window;

means for determining, for each mark and for each quadrant i (with i=1, 2, 3, 4), the areas of those portions of said alignment mark's image ($I_{MIR}, I'_{MIR}$) which extend beyond the outline of the reference mark's image ($I_{REF}$), and the areas of those portions of said reference mark's image ($I_{REF}$), which extend beyond the outline of said alignment mark's image ($I_{MIR}, I'_{MIR}$), said areas being termed "exposed" ($S_i^+, S_i^{+\prime}$) and "masked" ($S_i^+ S_i^{-\prime}$), respectively; and, computation means for determining from the values of said areas the translational error corrections ($\Delta X, \Delta Y$) and the rotational error corrections ($\Delta \theta$) required to adjust the position of said platen to cause the object disposed thereon to be correctly aligned with respect to the reference.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 11 is a more detailed view of the unit shown in FIG. 6 which determines the values of the "exposed" and "masked" areas.

FIG. 12 is a timing diagram showing the waveforms obtained before and after processing in the demultiplexer of FIG. 6.

DETAILED DESCRIPTION OF THE DRAWINGS

The following description relates to a preferred embodiment of the invention wherein the automatic alignment of an object is controlled by a computer such as the IBM System 1. The objects to be aligned are ceramic substrates provided each with two alignment marks having a given surface area. The substrate is aligned with respect to two inspection windows located a distance d from each other, and, more precisely, with respect to an axis of reference, which is the line segment between the centers of the two windows, and a center of reference, which is the midpoint of said line segment. The adjustments to be made in relation to each of said marks in each window are computed with respect to a reference mark's virtual image stored in a memory. It should be understood that other objects, such as integrated circuit chips, lithographic marks, and the like, can also be aligned in accordance with the teachings of the present invention.

Figure 1:
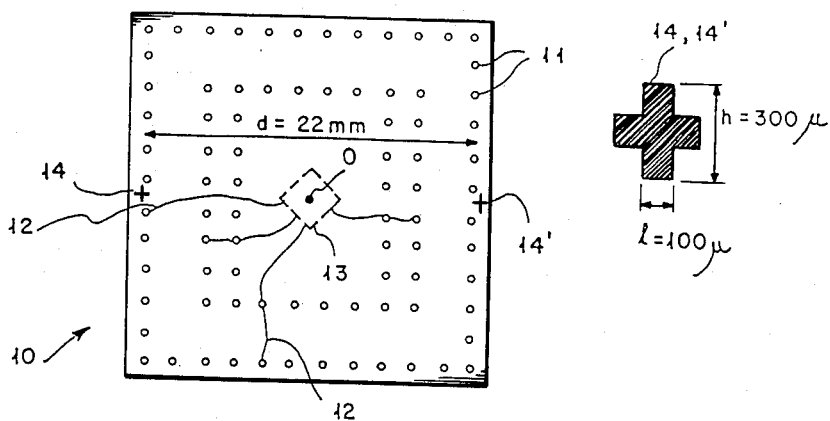
FIG. 1 shows a ceramic substrate provided with two alignment marks in the shape of a cross.

Thus, the present method of alignment is based upon the use of two alignment marks having each a given area, such as two small crosses, which are formed at the same time as the metallic pattern. The two marks are symmetrically located near the edges of opposite sides of the ceramic substrate, as shown in FIG. 1. While a single alignment mark would suffice to position the substrate, two marks are preferably used to achieve a much more precise alignment thereof.

The $24 \times 24$ mm ceramic substrate 10 shown in FIG. 1 has a number of holes 11 in which contact pins (not shown) are to be inserted, and a metal pattern 12 providing electrical interconnections between a silicon chip 13 and the pins. Two symmetrical marks in the shape of Greek crosses 14 and 14' separated by a distance $d = 22$ mm from each other have been formed on the substrate. As shown in FIG. 1, each of the two perpendicular shafts that make up each of these crosses is $100\mu$ wide and $300\mu$ long.

The present method requires that a conventional mechanical prealignment step be first performed. It will be assumed that this prealignment is accurate to within $50\mu$, i.e. that it allows the center of one of the crosses formed on the substrate to lie within a $50\mu \times 50\mu$ square the center of which coincides with the desired ideal center. Accordingly, the angle through which the cross should be rotated to cause its actual position to coincide with its ideal position is such that $\alpha < 50/100$, or $\alpha < 0.25°$, a negligible value. In other words, it is unnecessary to rotate the cross through the angle $\alpha$ to make the actual position of its center coincide with its ideal position, as a translational error correction ($\Delta X, \Delta Y$) will suffice to achieve this result. The values of $\Delta X$ and $\Delta Y$ must therefore be computed for each cross.

The image of each cross is collected by a matrix of photodiodes forming an inspection window. Obviously, the number of photodiodes and their configuration will be dependent on the type of alignment mark used and on the applicable operating conditions.

Figure 2:
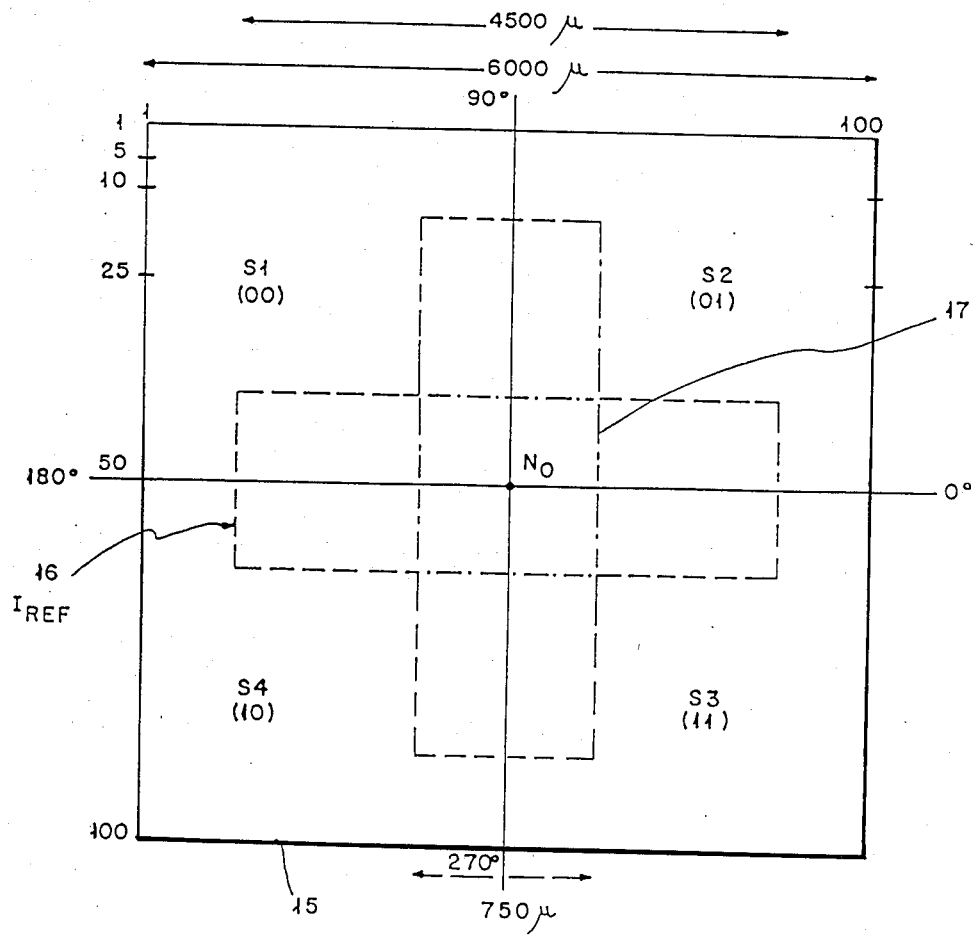
FIG. 2 shows an inspection window consisting of a matrix of $100 \times 100$ photodiodes and in which a reference mark will be perfectly centered.

FIG. 2 shows a matrix 15 of photodiodes divided into four fields or quadrants S1, S2, S3, S4, and of center $N_0$. Also shown in the figure is the image $I_{REF}$ of a correctly centered reference cross 16. In this embodiment, $I_{REF}$ is an electronic image automatically generated while scanning the image of the actual cross and is, therefore, a virtual image. For simplicity, $I_{REF}$ is shown in the center of the window. The dimensions of $I_{REF}$ are identical to those of image $I_{MIR}$ of the actual cross formed on the substrate.

Matrix 15 is associated with an optical system providing a magnification of $15 \times$. The matrix comprises $100 \times 100$ photodiodes each of which represents an elementary and individually addressable photosensitive area of $60\mu \times 60\mu$. Thus, the size of each pixel of the crosses on the substrate will be $4\mu \times 4\mu$. When enlarged, the area of the image of a cross ($h = 300\mu$ will be $4500\mu \times 4500\mu$ as compared with $6000\mu \times 6000\mu$ for the entire matrix.

Each quadrant (e.g. S1) is identified by means of a binary address (such as "00"). The coordinates x,y of an independently addressed photodiode permit locating the quadrant being investigated. The successive lines comprising the image of the actual cross are scanned at a rate defined by a clock. The video signal generated at the end of each line scan is representative of the configuration of the line. As has been seen, the mechanical pre-alignment step ensures that the center of the image of the cross lies within a $750\mu$ ($50\mu \times 15) \times 750\mu$ square 17 of center $N_0$.

Figure 3:
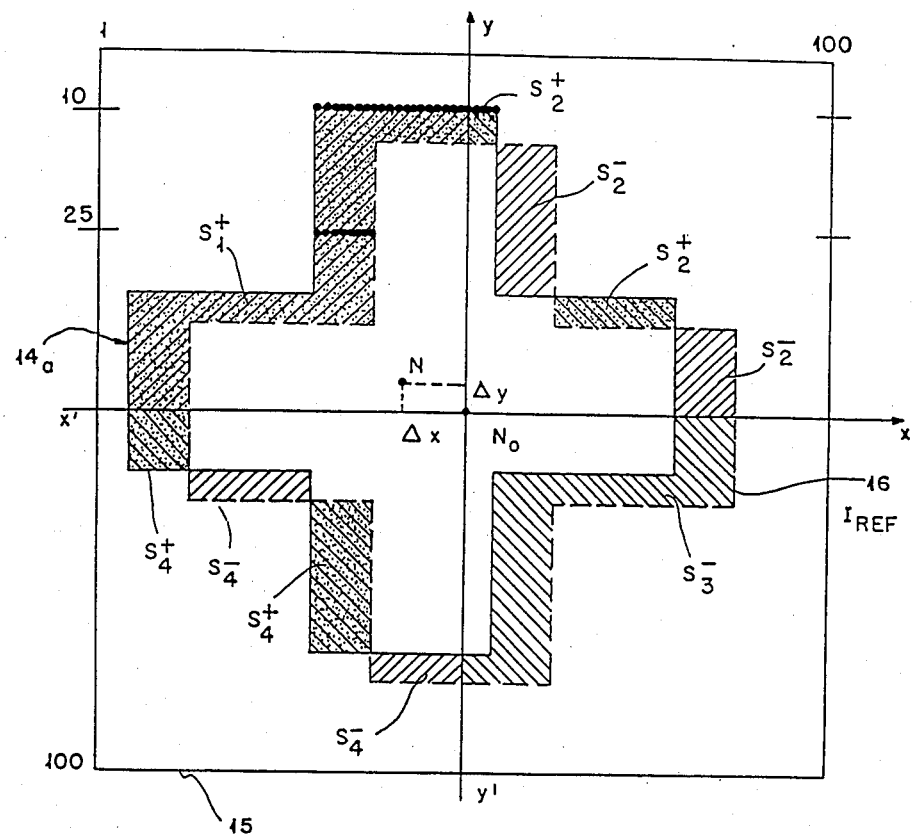
FIG. 3 shows the inspection window of FIG. 2 containing an alignment mark's enlarged image ($I_{MIR}$) off-centered with respect to the reference image ($I_{REF}$).

FIG. 3 illustrates a greatly exaggerated example of misalignment of the image $I_{MIR}$ of actual cross 14a, obtained by magnifying cross 14 fifteen times, with respect to the image $I_{REF}$ of the reference cross. As shown, the center N of $I_{MIR}$ lies in quadrant S1 a distance defined by values $\Delta x$ and $\Delta y$ from the center $N_0$ of $I_{REF}$. Note that, in this instance, $\Delta x<0$ and $\Delta y>0$, with the axes xx' and yy' shown in FIG. 3. In each quadrant i (i=1, 2, 3, 4), areas termed "exposed" ($S_i^+$) or "masked" ($S_i^-$) correspond, respectively, to those portions of the image of the actual cross that extend beyond the outline of the reference image, and to those portions of the reference image that extend beyond the outline of the image of the actual cross.

For example, as shown in FIG. 3, "exposed" area $S_i^+$ is that portion of the image of the actual cross which, in quadrant S1, extends beyond the outline of the reference image, while "masked" area $S_3^-$ is that portion of the reference image which, in quadrant S3, extends beyond the outline of the actual cross. Two areas S' and S'' are then defined such that $S'=\Delta x \times H$ and $S''=\Delta y \times H$, with $H=M \times h$, where H is the height of the image of the actual cross (hence that of the reference image) and M is the magnification of the optical system. Areas S' and S'' can be computed in different manners from the values of areas $S_i^+$ and $S_i^-$. In the specific instance of FIG. 3, in which N lies in quadrant S1, areas S' and S'' are first defined as:

$$S' = (S_1^+ - S_3^-) + S_2^- + S_4^+ + (S_4^- - S_2^+)$$

$$S'' = (S_1^+ - S_3^-) + S_4^- + S_2^+ + (S_4^- - S_2^+)$$

This simplifies to:

$$S' = (S_1^+ - S_4^-) + S_4^+$$

$$S'' = (S_1^+ - S_2^-) + S_2^+$$

It is interesting to note that, when N lies in quadrant S1 of address 00 ($\Delta x<0$ $\Delta y>0$), only one of the $S_i^-$ areas, $S_i^-$ is zero. Thus, $S_1^-=0$ characterizes the case where N lies in quadrant S1, that is, denotes a misalignment upwards and to the left of the image of the actual cross with respect to the reference cross.

The different possibilities for all four quadrants can be determined in a similar manner, as shown in Table I below.

TABLE I

| QUADRANT (address) | SIGN OF CORRECTIONS | CHARACTERISTIC ELEMENT | COMPUTATION OF CORRECTIONS | |
|---|---|---|---|---|
| $S_1(00)$ | $\Delta x<0$ $\Delta y>0$ | $S_1^-=0$ | $\Delta x = \dfrac{(S_1^+ - S_4^-) + S_4^+}{H}$ | $\Delta y = \dfrac{(S_1^+ - S_2^-) + S_2^+}{H}$ |
| $S_2(01)$ | $\Delta x>0$ $\Delta y>0$ | $S_2^-=0$ | $\Delta x = \dfrac{(S_2^+ - S_3^-) + S_3^+}{H}$ | $\Delta y = \dfrac{(S_2^+ - S_1^-) + S_1^+}{H}$ |
| $S_3(10)$ | $\Delta x>0$ $\Delta y<0$ | $S_3^-=0$ | $\Delta x = \dfrac{(S_3^+ - S_2^-) + S_2^+}{H}$ | $\Delta y = \dfrac{(S_3^+ - S_4^-) + S_4^+}{H}$ |
| $S_4(11)$ | $\Delta x<0$ $\Delta y<0$ | $S_4^-=0$ | $\Delta x = \dfrac{(S_4^+ - S_1^-) + S_1^+}{H}$ | $\Delta y = \dfrac{(S_4^+ - S_3^-) + S_3^+}{H}$ |

The cases where center N lies on one of axes $N_0x$ and $N_0y$ can readily be resolved. For example, if $\Delta x=0$, then N lies on the $N_0y$ axis, with $\Delta y \neq 0$, in which case $S_1^- = S_2^- = 0$, $S_1^+ = S_2^+$, $S_3^- = S_4^-$, and $S_3^+ = S_4^+ = 0$; the following value of $\Delta y$ is derived from the Table:

$$\Delta y = \frac{2S_1^+}{H}.$$

This computation is made for the two crosses, 14 and 14', which finally yields two couples of values ($\Delta x, \Delta y$) and ($\Delta x', \Delta y'$). Since these values are arrived at by computing surface areas, areas S' and S'' can be determined for each quadrant in a different way from Table I, as shown in Table II.

TABLE II

| QUADRANT (address) | SIGN OF CORRECTIONS | CHARACTERISTIC ELEMENT | COMPUTATION OF CORRECTIONS | |
|---|---|---|---|---|
| $S_1(00)$ | $\Delta x<0$ $\Delta y>0$ | $S_1^-=0$ | $\Delta x = \dfrac{(S_3^- + S_2^-) - S_2^+}{H}$ | $\Delta y = \dfrac{(S_3^- - S_4^+) + S_4^-}{H}$ |
| $S_2(01)$ | $\Delta x>0$ $\Delta y>0$ | $S_2^-=0$ | $\Delta x = \dfrac{(S_4^- + S_1^-) - S_1^+}{H}$ | $\Delta y = \dfrac{(S_4^- - S_3^+) + S_3^-}{H}$ |
| $S_3(10)$ | $\Delta x>0$ $\Delta y<0$ | $S_3^-=0$ | $\Delta x = \dfrac{(S_1^- + S_4^-) - S_4^+}{H}$ | $\Delta y = \dfrac{(S_1^- - S_2^+) + S_2^-}{H}$ |
| $S_4(11)$ | $\Delta x<0$ $\Delta y<0$ | $S_4^-=0$ | $\Delta x = \dfrac{(S_2^- + S_3^-) - S_3^+}{H}$ | $\Delta y = \dfrac{(S_2^- - S_1^+) + S_1^-}{H}$ |

The values $\Delta x, \Delta y$ and $\Delta x', \Delta y'$ can be obtained either directly, using Table I or II, or preferably by averaging the values provided by both Tables. The latter method has been found to yield better results.

We must now determine from these values the final translational and rotational error corrections ($\Delta X, \Delta Y; \Delta \theta$) required to achieve a virtually perfect alignment of the substrate 10 disposed on the platen.

Figure 4:
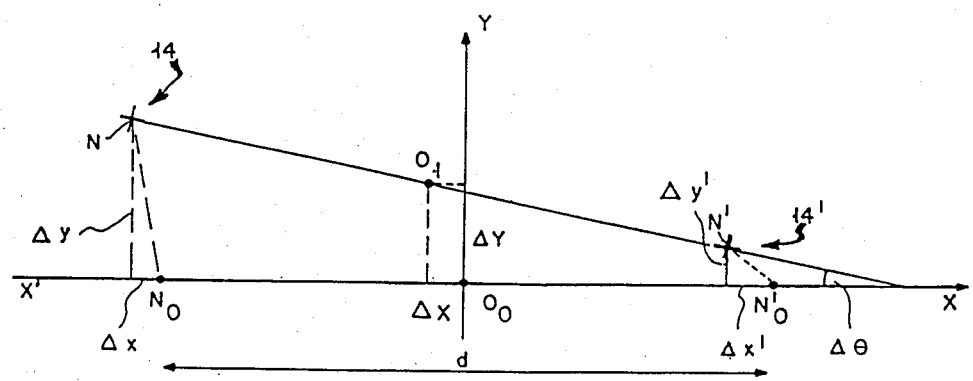
FIG. 4 illustrates the present method of determining the adjustments of the alignment platen required to cause the object shown in FIG. 1 to be correctly aligned.

In order that the details of the necessary computation may be more readily understood, reference will now be made to FIG. 4. This figure shows at N and N' the positions of the centers of the crosses, 14 and 14', formed on a substrate (not shown) of center $O_1$ that is to be realigned. $N_0$ and $N'_0$ are the positions of the centers of the inspection windows separated by a distance d, hence the postions of points N and N' after the substrate has been realigned. $O_0$ is the center of the realigned substrate, and also the center of rotation of the alignment platen and the center of reference. The axis x'x of the centers of the inspection windows is the axis of reference used in the alignment process.

$\Delta x$ and $\Delta y$ are the respective corrections to be made along the x and y axes to move the center N' of cross 14' to $N_0$.

$\Delta x'$ and $\Delta y'$ are the respective corrections to be made along the x and y axes to move the center N' of cross 14' to $N'_0$.

The coordinates of $O_1$ in the $X_0Y_0$ coordinate system are, therefore, $\Delta X$ and $\Delta Y$. $\Delta \theta$ is the angle between line segment NN' and axis X'X.

Since $\Delta \theta << $, we may consider that $\sin \Delta\theta \simeq 0$ and that $\cos \Delta\theta \simeq 1$. Given these approximations, we find:

$$\Delta X = \frac{\Delta x + \Delta x'}{2} \quad \Delta Y = \frac{\Delta y + \Delta y'}{2} \quad \Delta \theta = \frac{\Delta y - \Delta y'}{2d}$$

If $\Delta y \leq \Delta y'$, then $\Delta \theta \leq 0$, and if $\Delta y > \Delta y'$, then $\Delta \theta > 0$.

After applying corrections $\Delta X$ and $\Delta Y$, we find that the center $O_1$ of the substrate coincides with the ideal center $O_0$. A virtually perfect alignment is then obtained by rotating the substrate through angle $\Delta \theta$ about its center $O_0$.

The advantage of the present method over past techniques is that it is based upon a computation of areas such as $S_i^+$ and $S_i^-$, thereby compensating for the irregularities of the crosses formed on the substrate. As is known, these irregularities are inherent in the metallization process and cannot be avoided. The present method permits, especially when averaging the values obtained from Tables I and II, to practically ignore the imperfect geometry of the crosses and consequently to obtain a more precise alignment of the substrate than was formerly possible.

Figure 5:
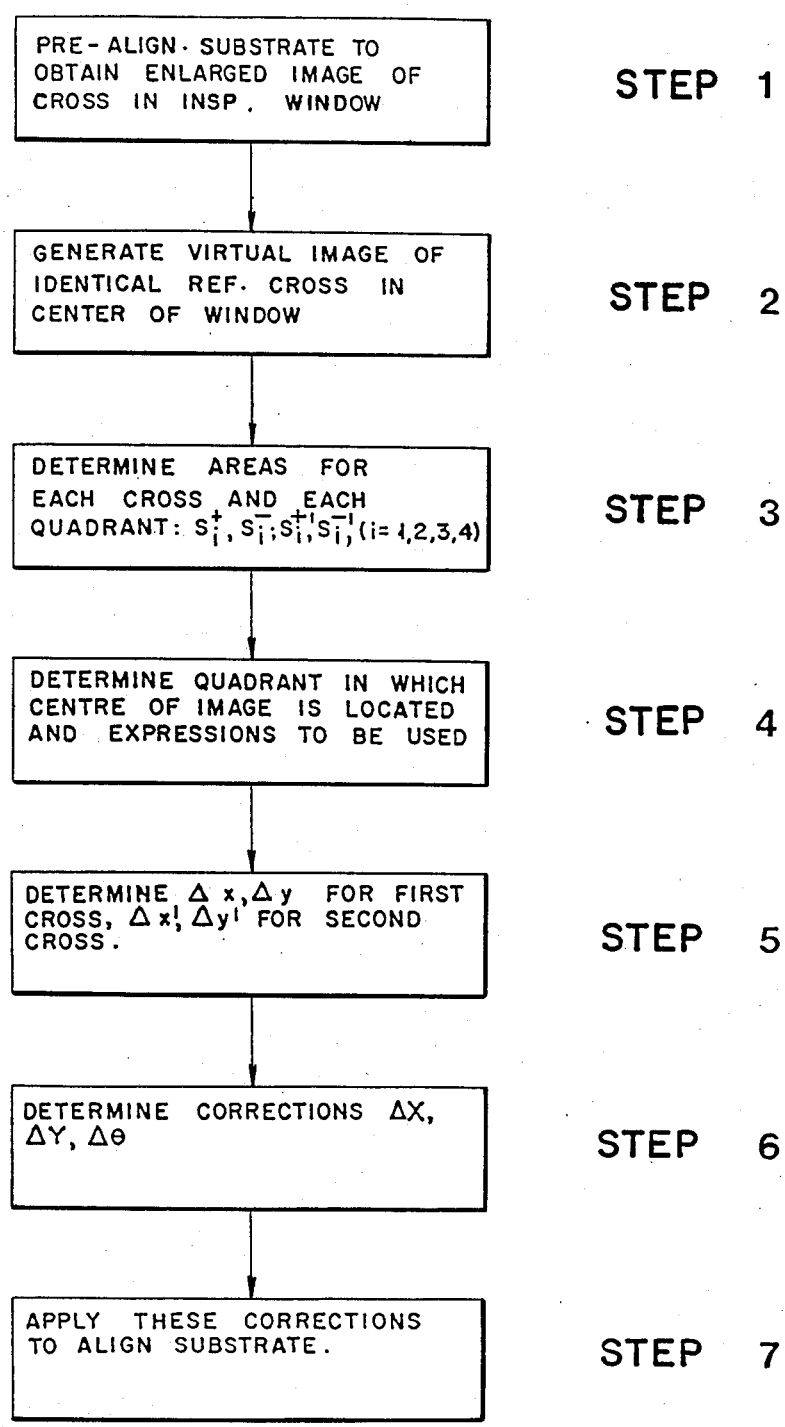
FIG. 5 shows the different steps of the present method of automatically aligning the object illustrated in FIG. 1.

FIG. 5 shows the various steps of the present method as described above.

In step 1, a mechanical prealignment of the substrate is performed. This provides a relatively coarse alignment of the two crosses with respect to their ideal positions. For example, if the prealignment is accurate to within $50\mu$, the center N (N') of cross 14 (14') will be contained in a square of center $N_0$ ($N'_0$) whose sides have a length of $50\mu \times 15 = 750\mu$ and the enlarged image of each cross on the substrate will be contained in the corresponding inspection window (15,15').

In step 2, a virtual image of a reference cross having the same dimensions as the image of an actual cross formed on the substrate is generated in the center of each inspection window.

In step 3, the "exposed" and "masked" areas, $S_i^+$, $S_i^-$ for the first cross and $S_i^{+\prime}$, $S_i^{-\prime}$ for the second cross, respectively, are computed for each quadrant i, with i=1, 2, 3, 4.

In step 4, computation means are used to determine, for each cross, which characteristic value $S_i^-$ is equal to zero, to derive therefrom, using the expressions shown in the above Table(s), the corrections required, i.e. $\Delta x$, $\Delta y$ for the first cross and $\Delta x'$, $\Delta y'$ for the second cross.

In step 5, the computation means determine these two couples of values.

In step 6, the computation means determine the values of the final translational and rotational error corrections ($\Delta X, \Delta Y; \Delta \theta$) required to obtain a virtually perfect alignment.

In step 7, the final corrections are made and a virtually perfect alignment of the substrate disposed on the platen is obtained. The tests of the substrate and its circuits may then be performed.

Figure 6:
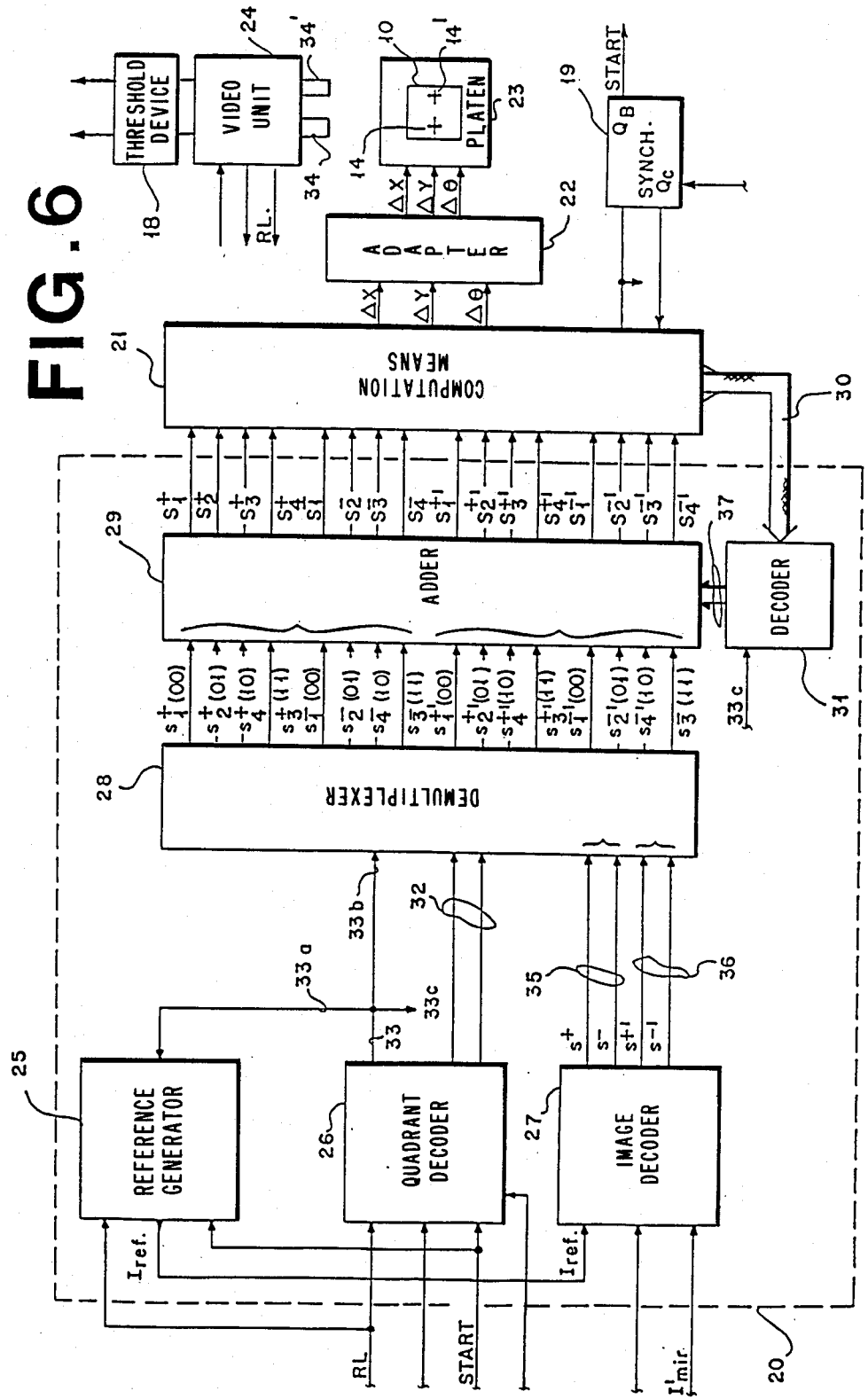
FIG. 6 is a block diagram of apparatus for implementing the method of FIG. 5.

An exemplary apparatus 20 for implementing the method of the present invention is shown in block diagram form in FIG. 6. Apparatus 20 is associated with computation means 21; with an adapter 22 that controls the motions of the alignment platen 23 on which the substrate 10 to be aligned is disposed; and with a video unit 24 that supplies video signals respectively corresponding to images $I_{MIR}$ and $I'_{MIR}$ of the crosses formed on the substrate. The video signals are fed to a threshold device 18 that supplies binary signals $I_{mir}$ and $I'_{mir}$ corresponding to images $I_{MIR}$ and $I'_{MIR}$. In what follows, video unit 24 and device 18 will be collectively called "inspection means".

Apparatus 20 comprises means 25 for generating a signal $I_{ref}$; computation means 26 for determining the address of the quadrant in which the addressed photodiode lies; computation means 27 for determining, on a line-by-line basis and for each cross, the values of elementary portions of the "exposed" and "masked" image areas, said elementary portions being designated $s+$, $s+'$ and $s-$,$s-'$, respectively; a demultiplexer 28 that distributes said values among the corresponding quadrants; and an adder 29 that sums these values to provide, for each cross and for each quadrant, the values of the "exposed" and "masked" areas $S_i^+,S_i^-$ and $S_i^{+\prime},S_i^{-\prime}$ respectively), as defined earlier, said values being supplied to computation means 21 whenever requested by said means 21 via bus 30 and decoder 31.

To align a substrate 10 placed on platen 23, computation means 21 first controls the execution of the mechanical prealignment operation, then informs means 25 and 26 by means of a Start signal that it is ready to compute the corrections required. The Start signal is generated by synchronization means 19 which receives as one input a Rd Req signal from means 21.

However, because the image is scanned continuously (in this example), the results of the first scan will not be valid as the prealignment of the substrate may happen to be completed at any time between the start and the end of the scan, so that the count of the counters will not be representative of the areas $S_i^+ \ldots S_i^{-\prime}$ to be determined. Accordingly, once a substrate is prealigned, the first Frame (or End of Image Scan) signal should be ignored and the count of the counters should only be taken into consideration upon the occurrence of the second Frame signal, that is, upon completion of a full scan, with the counters being loaded between the two signals. The Start signal, which controls the operation of means 25 and 26, will only be valid between the two Frame signals.

Synchronization means 19 is actually a shift register. The Frame and Rd Req signals are applied to its Clock and Preset inputs, respectively, and the Start signal is available on its $Q_B$ output. The signal on output $Q_C$ goes high when the second Frame signal is received (and when the signal on output $Q_A$, not shown, goes low), thereby providing a Stop signal that informs computation means 21 that the counters in adder 29 contain the desired data and that the computation of the corrections required can begin.

Computation means 26 continuously determines the quadrant in which each addressed photodiode is located (e.g. quadrant S1) and the corresponding address defined by two bits (e.g. "00"). This address is sent to demultiplexer 28 over wires 32. Means 26 receives as one input the system clock signal and generates internal synchronization signals which are sent to means 25, which generate the $I_{ref}$ signal, and to demultiplexer 28 over lines 33a and 33b, respectively. Lastly, means 26 receives from video unit 24 an End of Line Scan (or Line Synchronization) signal designated RL.

In addition to the Start signal, means 25 receives the RL signal and, via line 33a, the internal synchronization signal, and supplies computation means 27 with binary signal $I_{ref}$ (which is representative of the virtual reference image $I_{REF}$ shown in FIG. 3).

Simultaneously with the $I_{ref}$ signal, means 27, which determines the "masked" and "exposed" areas, receives from devices 34 and 34' associated with video unit 24 binary signals $I_{mir}$ and $I'_{mir}$ through threshold device 18. Each of devices 34 and 34' is essentially comprised of a matrix of photodiodes of the type described earlier which receives the enlarged image 14'a, 14'a of the cross 14, 14' formed on the substrate. Means 27 computes, on a line-by-line basis, the elementary values which, when added together, will provide values representative of areas $S_i^+$, $S_i^-$, $S_i^{+\prime}$, $S_i^{-\prime}$ for a complete image. All three input signals, $I_{ref}$, $I_{mir}$ and $I'_{mir}$, are synchronized.

Figure 7:
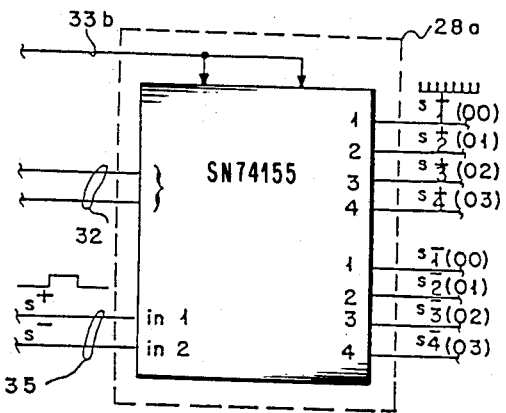
FIG. 7 is a more detailed view of an embodiment of one half of the FIG. 6 demultiplexer.

After a given line of the image of the actual cross formed on the substrate has been scanned, means 27 generates a signal whose duration is representative of the length of the elementary "exposed" ($s^+$) and "masked" ($s^-$) portions of that line. For example, as shown in FIG. 3, when scanning the 25th line of the image $I_{MIR}$ of the actual cross, each of the "exposed" and "masked" segments is about 8 photodiodes wide; accordingly, means 27 will generate signals $s^+ = 8T$ and $s^- = 8T$, where T is the period of the system clock, since a line segment corresponding to the width of one photodiode is scanned per clock period. In the instance of the 10th line, means 27 would generate a signal $s^+ = 24T$, corresponding to 20 photodiodes for portion $S_1^+$ plus 4 photodiodes for portion $S_2^+$. Note that the values supplied by means 27 do not specify the quadrants involved. The signals representative of elementary values $s^+$, $s^-$ for the first cross, and $s^{+\prime}$, $s^-$ for the second cross are respectively fed to demultiplexer 28 over lines 35 and 36. The corresponding quadrants are determined by demultiplexer 28, using the data received from computation means 26 over lines 32; in this example, demultiplexer 28 would determine that $s^+ = 24T$ consists of $s_1^+(00) = 20$ relating to quadrant S1 (of address 00) and of $s_2^+(01) = 4$ relating to quadrant S2 (of address 01). In this embodiment, demultiplexer 28 consists of two identical portions, 28a and 28b, each of which is comprised of a conventional module marketed as P/N SN74155 as shown in FIG. 7. This figure clearly shows the connections to be made to ensure a correct processing of elementary values $s^+$ and $s^-$ (lines 35). The other module (28b, not shown) is similarly connected to allow processing of values $s^{+\prime}$ and $s^{-\prime}$ (lines 36). The binary signals representing $s^+$, $s^-$, $s^{+\prime}$ and $s^{-\prime}$ are converted by demultiplexer 28 into trains of pulses that are sent to adder 29 under control of the internal synchronization signal applied to its Strobe input via line 33b.

This conversion is convenient in that said pulses will later be fed to counters. For example, all $s_1^+$ values obtained on a line-by-line basis are summed in adder 29 and the total, provided in the form of a binary word, will be representative of area $S_1^+$.

Figure 8:
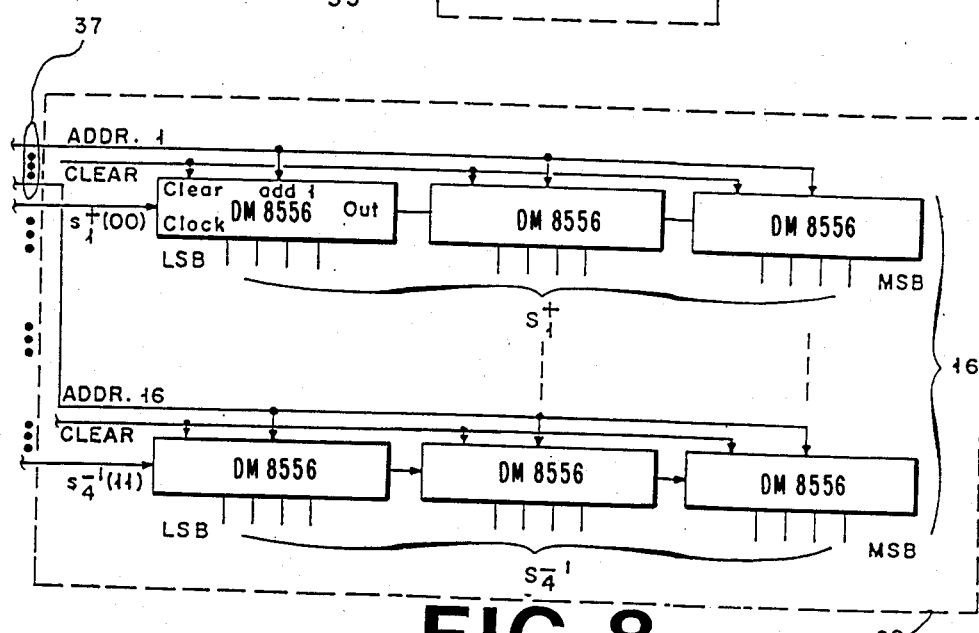
FIG. 8 illustrates an embodiment of the adder of FIG. 6.

Adder 29 comprises sixteen 12-bit counters capable of attaining a maximum count of $50 \times 50 = 2500$ pixels in this example in which a matrix of $100 \times 100$ photodiodes is used. These counters can be addressed from decoder 31 under the control of computation means 21. For convenience, each of said counters is replaced in the present embodiment by three 4-bit counters of the tristate type marketed as P/N DM8556. This embodiment is shown in FIG. 8, together with details of the connections required. As shown, values $S_1^+ \ldots S_4^-$ are available at the output of the adder as 12-bit binary words.

Finally, after all lines of the image have been scanned, the contents of each counter will be representative of a value $S_i^+$, $S_i^-$ for the first cross, and $S_i^{+\prime}$, $S_i^{-\prime}$ for the second cross. As has been mentioned, when the Stop signal is received by computation means 21 from synchronization means 19, means 21 reads out counter values $S_1^+$, $S_2^+$, . . . , $S_4^{-\prime}$ in succession, applying appropriate addresses to decoder 31 via bus 30. Bus 30 comprises four lines connected to the Address inputs of decoder 31. This decoder receives as another input the internal synchronization signal via line 33c and is provided with an output bus 37 comprising sixteen lines (ADDR1 . . . ADDR16) respectively connected to the ADDR inputs of the counters comprising a row of counters, as shown in FIG. 8. The addresses of the respective rows of counters are stored in the memory of computation means 21. The decoder may consist of a module of the type marketed as P/N SN74154. The Clear input of each counter is connected to a Clear line, so that the counter can be reset to zero under the control of computation means 21 after reading out values $S_1^+$, $S_2^+ \ldots S_4^{-\prime}$.

Computation means 21, which may be, for example, an IBM System 1, first determines intermediate values $\Delta x$, $\Delta y$ and $\Delta x'$, $\Delta y'$, then derives therefrom the values of corrections $\Delta X$, $\Delta Y$ and $\Delta \theta$ required to properly align the platen, selecting appropriate expressions from those listed in Tables I and II above.

Figure 9A:
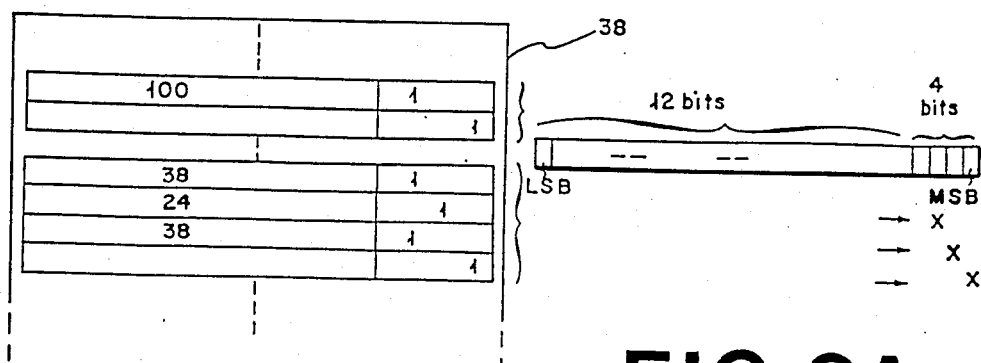
FIG. 9A shows the method of writing bits in the read-only memory located in the binary signal ($I_{ref}$) generating unit of FIG. 6.
Figure 9B:
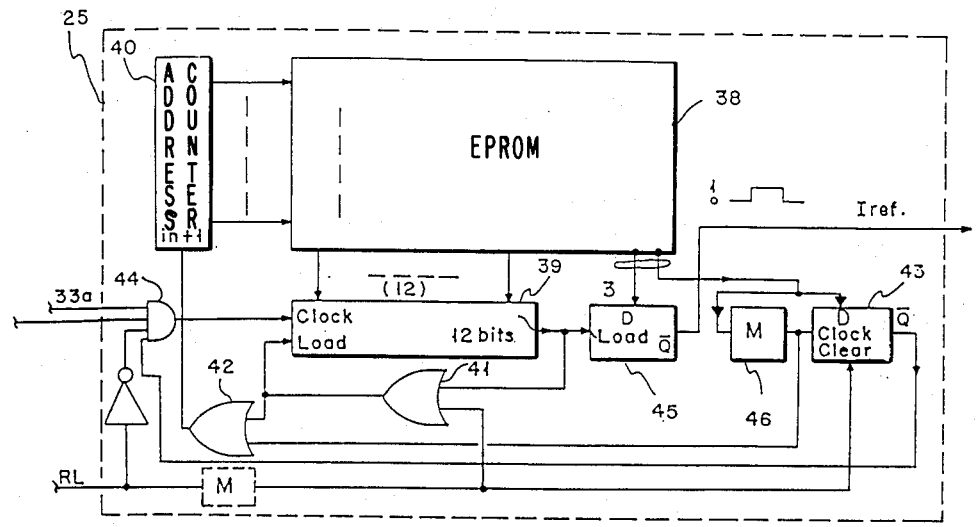
FIG. 9B is a more detailed view of the binary signal ($I_{ref}$) generating unit of FIG. 6.

The operation of $I_{ref}$ signal generating means 25 will be more readily understood with reference to FIGS. 9A and 9B. Means 25 generates 16-bit data words and 16-bit separator words whose format is shown in FIG. 9A. In such a data word, the first twelve bits represent the binary value of the number of pixels (successive black and white dots) comprising a given line (or portion of line) of the image detected by a corresponding row of 100 photodiodes in the inspection window. For example, as shown in FIG. 2, the fifth row would detect 100 white dots (absence of image) and means 25 would therefore generate the binary equivalent of "100"; similarly, the 25th row would successively detect about 38 white dots, 24 black dots and 38 white dots (noted 38W-24B-38W) and means 25 would successively generate the binary equivalents of values "38", "24" and "38", as shown in FIG. 9A. The remaining four bits, only three of which are used, are indicator bits. Two of these indicate whether the dots are black (B indicator) or white (W indicator), and the third bit denotes the RL signal (RL indicator). The RL signal goes high at the end of an image line scan and remains high for eight T clock periods, then goes low again and remains low throughout the next line scan.

Groups of 16-bit data words representing a given line are separated by a 16-bit separator word (S). Only one of the sixteen bits of separator S, namely, indicator RL, is used. All words representative of a line are successively stored in a memory 38, which may be similar, for example, to the conventional EPROM marketed as P/N MM2716.

The first data word stored at address 0 is loaded in register 39 (which is actually a count-down counter) of FIG. 9B during an initialization sequence that mainly consists in resetting all of the circuits of FIG. 9B and in particular register 39 and address counter 40 associated with EPROM 38. The second data word will only be loaded into register 39 when the Borrow output thereof generates a pulse at the end of the countdown of the first data word. This pulse also causes address counter 40 to be incremented through OR gates 41 and 42. Assume that the count down of the data word representing 38 white dots (or 38W) is nearly completed in register 39 and that the signal on output $\bar{Q}$ of D-type latch 45 is at a low level, i.e. $I_{ref}=0$. The next data word, representing 24 black dots (24B), is available on the output bus of memory 38. At count 0, the Borrow output of register 39 provides a pulse which is applied to the Clock input of D-type latch 45, causing same to change state. The indicator bits corresponding to data word "38W", i.e. W=1 and B=0, become W=0 and B=1 in the case of data word "24B". To this end, either the W indicator or the B indicator can be applied to the D input of latch 45, as shown in FIG. 9B.

The signal on output $\bar{Q}$ of latch 45 goes high ($I_{ref}=1$). Simultaneously, the pulse obtained on the Borrow output of register 39 is applied to the Load input thereof through OR gate 41 to cause value 24, corresponding to data word "24B", to be loaded therein. This pulse is also applied to the IN+1 input of address counter 40 through OR gate 42 to increment its count value by 1. The next data word, "38W", is then available on the output bus of the memory.

Register 39 counts down from 24 to 0 under control of the clock pulses (line 33a) applied thereto through AND gate 44. As mentioned, the Start signal has a logical 1 value throughout the duration of the image scan between two consecutive Frame signals. The End of Line Scan (or RL) signal can only inhibit AND gate 44 at the end of a line (when RL=1 and $\overline{RL}$=0) for a time interval equal to 8T. Thus, signal $I_{ref}=1$ throughout the count down, i.e. during a time interval of 24T.

At count 0 of register 39, latch 45 changes states, the values of indicators B and W are inverted since the next data word "38W" already is available on the output bus, and signal $I_{ref}$ goes low ($I_{ref}=0$).

Separator word S then becomes available on the output bus and indicator bit RL (which has a logical 1 value) is reshaped in a single-shot (M) 46 and applied to the Clock input of a D-type latch 43. Simultaneously, indicator RL is applied to the D input of latch 43. The signal obtained on output $\bar{Q}$ of latch 43 goes to the 0 logical level and is applied to AND gate 44 which is thereby inhibited. As a result, the clock signals (line 33a) are no longer transmitted to register 39 which, therefore, is prevented from counting down from 38 to 0. Signal $I_{ref}$ remains at the 0 level until signal RL is applied to the Clear input of latch 43, either directly or preferably through a single-shot M shown in dotted lines, to allow the next countdown to begin. This solution, while more complex than if one merely had to count down from 38 to 0 before changing to the next line, ensures that the RL signal is synchronized with the start of the countdown for the next line.

Figure 10:
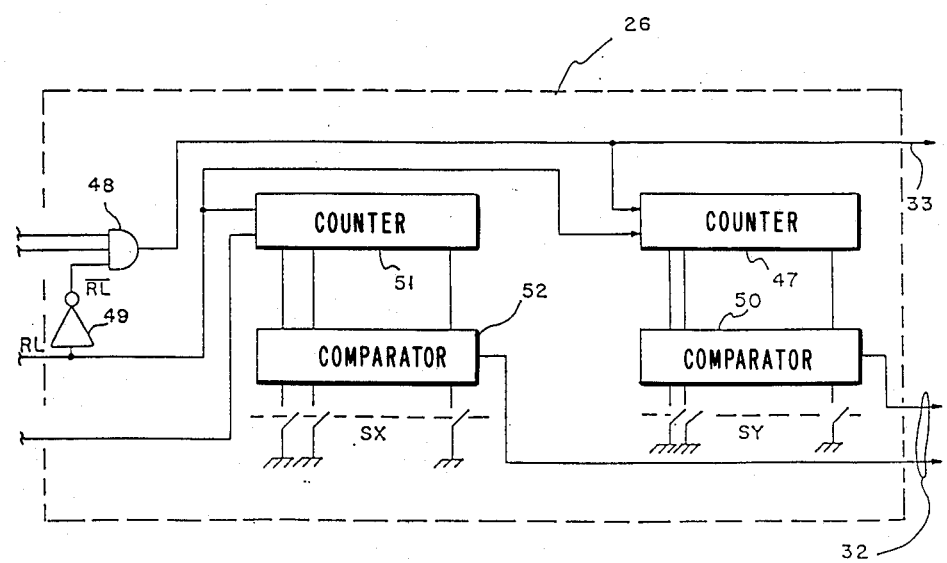
FIG. 10 is a more detailed view of the quadrant address determining unit of FIG. 6.

FIG. 10 illustrates an embodiment of means 26 which, as mentioned, serves to determine the addresses of the quadrants. As is known, in a matrix of N×N photodiodes, each quadrant would consist of N/2 lines×N/2 columns. In this example, N=100 (see FIGS. 2 and 3). The clock pulses are counted by a column counter 47 until the counter is reset to zero when the RL signal is applied thereto through an inverter 49 and an AND gate 48. The contents of counter 47 are applied as one input to a comparator 50, which receives as another input the value "50" defined by switches SY. When the $51^{st}$ pulse occurs, the signal on the "greater than" output of comparator 50 goes to the 1 level and is sent to demultiplexer 28 over one of the two lines 32. Line counter 51 and comparator 52 associated therewith operate in the same manner as counter 47 and comparator 50, except that counter 51 counts the RL signals until it is reset to zero by the Rd Req signal supplied by computation means 21. The binary value (such as "00") present on lines 32 is the address of the quadrant (such as S1) being examined in the inspection window. Note that the internal synchronization signal sent over line 33 is identical to the system clock signal, except that it is inhibited when the RL signal is high (hence when $\overline{RL}$=0) or when the Start signal is low.

FIG. 11 illustrates an embodiment of means 27 that serves to compute the areas of the "masked" and "exposed" portions. Since this merely involves subtracting binary signals, means 27 are comprised of four NOR gates 53–56 and three inverters 57–59. For example, $s^+ = \overline{I_{mir} + I_{ref}}$ represents that portion of the image $I_{MIR}$ of one of the crosses formed on the substrate which is "exposed" with respect to virtual image $I_{REF}$ (that is, which extends beyond the outline of $I_{REF}$) for a given line.

FIG. 12 shows the waveforms obtained for a given line such as the $25^{th}$ line. In particular, the figure shows the waveform corresponding to binary signal $s^+$ as sampled in demultiplexer 28 under the control of the internal synchronization signal (which is identical to the clock signal except at the end of a line) applied to its Strobe input. In this case, the address obtained on lines 32 is "00". Accordingly, the output signal $s_1^+(00)$ from the demultiplexer will consist of eight pulses, as illustrated.

While the invention has been particularly shown and described with reference to a preferred embodiment thereof, it will be understood by those skilled in the art that numerous changes in form and detail may be made therein without departing from the spirit and scope of the invention.

What is claimed is:

1. A method for automatically aligning an object with respect to a reference, said object having a pair of alignment marks each having a given area, said reference being comprised of two inspection windows whose centers are located a distance d from each other along an axis of reference and whose center comprises a center of reference, said method being characterized in that it comprises the steps of:
   placing said object on an alignment platen;
   positioning said object so that each alignment mark ($I_{MIR}$, $I'_{MIR}$) thereon appears entirely within one said inspection window;
   generating at the center of each inspection window a virtual image ($I_{REF}$) of an alignment mark, said virtual image having the same dimensions as an alignment mark ($I_{MIR}$, $I'_{MIR}$), said virtual image being superimposed over the alignment mark in each said inspection window;

determining exposed portion which comprises the portion of the alignment mark ($S_i^+$, $S_i^{+\prime}$), where i is 1,2,3 and 4, in each quadrant of each inspection window which does not have said virtual image superimposed over it and determining masked portions comprising the portion of the virtual image ($S_I^-$, $S_i^{-\prime}$) in each quadrant of each inspection window which does not superimpose the alignment mark;

calculating, using computation means responsive to said exposed portions and said masked portions, the translational ($\Delta X$ and $\Delta Y$) and rotational ($\Delta \theta$) correction needed to position said object in alignment with said virtual image and causing said alignment platen to be translationally and rotationally adjusted to thereby position said object in alignment with said virtual image.

2. A method according to claim 1, characterized in that said object is a ceramic substrate (10) and in that said alignment marks consist of two small crosses (14,14') separated by a distance d and formed at the same time as the metallic pattern.

3. A method according to claim 1 or 2, characterized in that said inspection windows (15,15') are each comprised of a matrix of N×N photodiodes and in that the centers of said windows are located a distance d from each other.

4. A method according to claim 1, characterized in that said translational error corrections ($\Delta x, \Delta y; \Delta x', \Delta y'$) are derived from a computation of areas ($S_i^+$, $S_i^-$; $S_i^{+\prime}$, $S_i^{-\prime}$) where i is 1,2,3 and 4, by first determining which of said areas is zero ($S_i^- = 0$), and by then using the expressions given in Table I below to compute the corresponding corrections $\Delta x, \Delta y; \Delta x', \Delta y'$:

TABLE I

| CHARACTERISTIC ELEMENT | COMPUTATION OF $\Delta x$ and $\Delta y$ | |
|---|---|---|
| $S_1^- = 0$ | $\Delta x = \dfrac{(S_1^+ - S_4^-) + S_4^+}{H}$ | $\Delta y = \dfrac{(S_1^+ - S_2^-) + S_2^+}{H}$ |
| $S_2^- = 0$ | $\Delta x = \dfrac{(S_2^+ - S_3^-) + S_3^+}{H}$ | $\Delta y = \dfrac{(S_2^+ - S_1^-) + S_1^+}{H}$ |
| $S_3^- = 0$ | $\Delta x = \dfrac{(S_3^+ - S_2^-) + S_2^+}{H}$ | $\Delta y = \dfrac{(S_3^+ - S_4^-) + S_4^+}{H}$ |
| $S_4^- = 0$ | $\Delta x = \dfrac{(S_4^+ - S_1^-) + S_1^+}{H}$ | $\Delta y = \dfrac{(S_4^+ - S_3^-) + S_3^+}{H}$ | where H is the height of the image of the alignment mark in the inspection window.

5. A method according to claim 1, characterized in that said translational error corrections ($\Delta x, \Delta y; \Delta x', \Delta y'$) are derived from a computation of areas ($S_i^+$, $S_i^-$; $S_i^{+\prime}$, $S_i^{-\prime}$) where i is 1,2,3 and 4, by first determining which of said areas is zero (sin=0), and by then using the expressions given in Table II below to compute the corresponding corrections $\Delta x, \Delta y; \Delta x', \Delta y'$:

TABLE II

| CHARACTERISTIC ELEMENT | COMPUTATION OF x and $\Delta y$ | |
|---|---|---|
| $S_1^- = 0$ | $\Delta x = \dfrac{(S_3^- + S_2^-) - S_2^+}{H}$ | $\Delta y = \dfrac{(S_3^- - S_4^+) + S_4^-}{H}$ |
| $S_2^- = 0$ | $\Delta x = \dfrac{(S_4^- + S_1^-) - S_1^+}{H}$ | $\Delta y = \dfrac{(S_4^- - S_3^+) + S_3^-}{H}$ |
| $S_3^- = 0$ | $\Delta x = \dfrac{(S_1^- + S_4^-) - S_4^+}{H}$ | $\Delta y = \dfrac{(S_1^- - S_2^+) + S_2^-}{H}$ |
| $S_4^- = 0$ | $\Delta x = \dfrac{(S_2^- + S_3^-) - S_3^+}{H}$ | $\Delta y = \dfrac{(S_2^- - S_1^+) + S_1^-}{H}$ |

6. A method according to claims 4 or 5, characterized in that said corrections $\Delta x$, $\Delta y$ and $\Delta x'$, $\Delta y'$ are determined by averaging the values provided by Tables I and II.

7. A method according to claims 4 or 5, characterized in that said exposed and masked portions, where i is 1, 2, 3, and 4, are determined from signals representative of said elementary portions $s^+$, $s^{+\prime}$, $s^-$, $s^{-\prime}$ of each scanned line and whosed duration is proportional to the number of activated photodiodes, which are obtained from an array of photodiodes positioned to measure light reflected from elemental areas of each said inspection window, said signals being associated with the corresponding quadrants to provide signal $s_i^+$, $s_i^-$; $s_i^{+\prime}$, $s_i^{-\prime}$ that are then sampled, with resultant pulses being fed to counters, so that, after scanning a complete image in said inspection window, the contents of said counters will be representative of said areas ($S_1^+, \ldots S_4^-$; $S_4^{+\prime}, \ldots S_4^{-\prime}$).

8. A method according to claim 4 or 5, characterized in that the corrections ($\Delta X$, $\Delta Y$, $\Delta \theta$) required to adjust the position of the alignment platen to cause the substrate thereon to be correctly aligned are defined as:

$$\Delta X = \frac{\Delta x + \Delta x'}{2} \quad \Delta Y = \frac{\Delta y + \Delta y'}{2} \quad \Delta \theta = \frac{\Delta y - \Delta y'}{2d}$$

9. A method according to claim 3 characterized in that said calculating step requires said translational correction ($\Delta X$, $\Delta Y$) and rotational correction ($\Delta \theta$) to be a function of only the translational distances between the center of each said alignment mark and the center of said virtual image in each said window ($\Delta X$, $\Delta Y$, $\Delta X'$, $\Delta Y'$).

10. A method according to any one of claims 4 or 5 characterized in that exposed portions ($S_i{}^+$, $S_i{}^{+\prime}$) and mashed portions ($S_I{}^-$, $S_i{}^{-\prime}$), where i is 1, 2, 3 and 4, are determined from signals from an array of photodiodes positioned to measure light reflected from elemental areas of each said inspection window.

11. Apparatus for automatically aligning an object, said object having a pair of identical alignment marks thereon, each alignment mark having a given area, the center of the centers of the two being disposed a distance d apart, said apparatus comprising, in combination:

support means for supporting said object, said support means being operative in response to externally generated translation and rotation signals to move said object in two translational directions and a rotational direction;

inspection means for inspecting said object including two inspection windows each divided into quadrants and disposed so that one said alignment mark on said object is fully contained within each said inspection window;

means to generate the virtual image of a reference mark having the identical size and shape of each said alignment mark and to center said reference mark at the center of each said inspection window;

means for determining the area of the exposed portions ($S_i{}^+$, $S_i{}^{+\prime}$, where i=1, 2, 3 and 4) which comprise the area of said alignment mark that extends beyond the outline of said reference mark and for determining the area of the masked portions ($S_i{}^-$, $S_i{}^{-\prime}$, where i=1, 2, 3 and 4) which comprise those areas of said reference mark that extend beyond said alignment mark in each said window; and computation means responsive to said area of exposed portions and to said area of masked portions to produce said translation signals and said rotation signals to cause said support means to move said object into alignment with said reference alignment mark.

12. Apparatus according to claim 11, characterized in that said object is a ceramic substrate (10) and in that said alignment marks consist of two small crosses (14,14') formed at the same time as the metallic pattern.

13. Apparatus according to claim 12, characterized in that each of said inspection windows (15,15') consists of a matrix of N×N photodiodes and in that the centers of said windows are separated from each other by a distance d.

14. Apparatus according to claim 11, characterized in that said means for determining the area of said exposed portion and said masked portion comprises:

means (27) for computing the values of said elementary portions $s^+$, $s^-$, $s^{+\prime}$, $s^{-\prime}$ to provide corresponding signals, irrespective of the quadrants involved;

means (26) for determining said quandrants ($S_i$);

means (28) for multiplexing and sampling said signals to provide trains of pulses $s_i{}^+$, $s_i{}^-$; $s_i{}^{+\prime}$, $s_i{}^{-\prime}$ pertaining to the various quadrants; and, means (29) for counting the number of said pulses per quadrant to determine said "exposed" and "masked" areas $S_i{}^+$, $S_i{}^-$; $S_i{}^{+\prime}$, $S_i{}^{-\prime}$.

* * * * *

UNITED STATES PATENT AND TRADEMARK OFFICE
CERTIFICATE OF CORRECTION

PATENT NO. : 4,672,676
DATED : June 9, 1987
INVENTOR(S) : Claude J. Linger

It is certified that error appears in the above-identified patent and that said Letters Patent is hereby corrected as shown below:

On the title page, item [54], please change the first word in the title to read --Method--.

Title page, ABSTRACT [57] line 6 "insepection" should read --inspection--

Column 5, line 29, change "$S_i^+$" to read --$S_1^+$--

Column 7, line 25, The sentence should read --If $\Delta y \leq \Delta y'$, then $\Delta \theta \leq 0$, and--

Claim 5 Col. 14, line 25, change "(sin=0)" to read --($\overline{S}i = 0$)--.

Claim 7 Col. 14, line 54, change "whosed" to read --whose--.

UNITED STATES PATENT AND TRADEMARK OFFICE
CERTIFICATE OF CORRECTION

PATENT NO.  : 4,672,676

DATED       : June 9, 1987

INVENTOR(S) : Claude J. Linger

It is certified that error appears in the above-identified patent and that said Letters Patent is hereby corrected as shown below:

Claim 10
Col. 15, line 14    change "mashed" to --masked--.

Signed and Sealed this

Twenty-ninth Day of May, 1990

Attest:

HARRY F. MANBECK, JR.

*Attesting Officer*         *Commissioner of Patents and Trademarks*